United States Patent [19]
Fujii

[11] Patent Number: 5,936,481
[45] Date of Patent: Aug. 10, 1999

[54] SYSTEM FOR IMPEDANCE MATCHING AND POWER CONTROL FOR APPARATUS FOR HIGH FREQUENCY PLASMA TREATMENT

[75] Inventor: Shuitsu Fujii, Fukuyama, Japan

[73] Assignee: Adtec Corporation Limited, Hiroshima, Japan

[21] Appl. No.: 09/007,428

[22] Filed: Jan. 15, 1998

[30] Foreign Application Priority Data

Sep. 10, 1997 [JP] Japan .................... 9-264844

[51] Int. Cl.$^6$ ..................................... H03H 7/40
[52] U.S. Cl. ............................ 333/17.3; 333/32
[58] Field of Search .................. 333/17.3, 32, 99 PL

[56] References Cited

U.S. PATENT DOCUMENTS

| | | | |
|---|---|---|---|
| 5,473,291 | 12/1995 | Brounley | 333/17.3 |
| 5,585,766 | 12/1996 | Shel | 333/17.3 |
| 5,654,679 | 8/1997 | Mauretic et al. | 333/17.3 |
| 5,689,215 | 11/1997 | Richardson et al. | 333/17.3 |

Primary Examiner—Paul Gensler
Attorney, Agent, or Firm—Morgan & Finnegan, LLP

[57] ABSTRACT

The invention provides an impedance matching and power control system not resorting to mechanical control for a device for high frequency plasma treatment. An impedance matching unit 14 inserted in the terminal end of a power feed line 3 extending from a high frequency power oscillator 1 to a plasma chamber 2 comprises phase detecting means 17, a load-associated detector 19 having the function of detecting voltage, current, and phase angle, and an arithmetic and output section 21, whereby the impedance matching unit delivers a frequency control signal corresponding to the detected phase and a power signal representing the consumed power of the plasma chamber as calculated from the voltage, current and phase angle. The high frequency power oscillator comprises an oscillation control section 24 for controlling the oscillation frequency thereof according to said frequency control signal, and an output control section including a summing amplifier 25 which receives an external set power signal and the detected power signal to find the difference between the two values of power, thus controlling its own output power according to the difference.

4 Claims, 4 Drawing Sheets

SYSTEM OF THE PRIOR ART

OUTPUT CHARACTERISTIC CURVE
OF PHASE DETECTOR

OUTPUT CHARACTERISTIC CURVE
OF LOAD IMPEDANCE DETECTOR

SYSTEM FOR IMPEDANCE MATCHING AND POWER CONTROL FOR APPARATUS FOR HIGH FREQUENCY PLASMA TREATMENT

TECHNICAL FIELD

The present invention relates to a system for effecting the impedance matching between the output impedance of a high frequency power oscillator and the impedance of a plasma chamber used in an apparatus for processing semiconductors and the like with plasma using high frequency power.

In an apparatus for plasma process used in applying a processing, such as etching, CVD or sputtering, to semiconductors or the like, an impedance matching device, as shown in FIG. 1, is installed at the terminal end of a power feed line using a coaxial cable 3 (length: N×λ/2) extending from a high frequency power oscillator 1 to a plasma chamber 2, that is, it is installed in the vicinity of the plasma chamber 2. In the case of a common automatic servo control system, this matching device is formed as an automatic impedance matching unit 4, provided at the input side thereof with a detecting circuit 5 which comprises a section for detecting a voltage/current phase difference and a section for detecting a load impedance, which produce voltage signals having a relationship to frequency (phase) and impedance, respectively, as indicated by curves shown in FIGS. 4 and 5. And a load servo amplifier 6a and a phase servo amplifier 6b, which respectively receive output signals from the individual detecting section, control variable capacitors $C_1$ and $C_2$ in an LC circuit through motors $M_1$ and $M_2$, thereby providing impedance matching.

The impedance of the plasma chamber 2 is represented by $Z_L = R_L \pm jX_L$, and in order to supply power to such load with the greatest efficiency, it is necessary to effect impedance conversion, i.e., impedance matching adjustment, such that the real part resistance=50Ω, which is equal to the output impedance of the high frequency power oscillator 1 as seen from the input side of this impedance matching unit 4, i.e., equal to the characteristic impedance (50Ω) of the coaxial cable 3 and the imaginary part ($\pm jX_L = 0\Omega$). If matching is thus attained, that which includes the impedances of the impedance matching unit 4 and plasma chamber 2 is the impedance, $Z = 50 \pm j0(\Omega)$, as seen from the power source.

However, the variable capacitors $C_1$ and $C_2$ and the fixed or variable inductor L installed in such matching circuit produce heat due to the multiplicative effect of the conductor resistance and the skin effect when high frequency power passes therethrough, inevitably entailing power consumption. Further, the impedance of the plasma chamber changes with time owing to deposition due to the plasma processing, the amounts by which the variable capacitors and inductor are to be adjusted also change and so does the amount of the power passing therethrough, so that the power loss of the impedance matching unit cannot be maintained at a constant value.

In the typical impedance matching method of the conventional type, an external setting signal for high frequency power is added to the high frequency power oscillator 1 to ensure that the output power (travelling wave power) of the oscillator is constant. And by neglecting the losses such as those included in connected wiring in the impedance matched state, it is assumed that the condition for maximum power supply:

Supplied power (travelling wave power) = cable power loss + internal power loss of the impedance matching unit + internal consumed power of the plasma chamber is satisfied, under which condition, it is intended to control the supplied power for the latter to be constant, thereby controlling the internal consumed power (load power) of the plasma chamber in order for said internal power consumption to be constant. However, since the internal power loss of the impedance matching unit does not become constant for the previously described reason, there is a problem that the internal consumed power of the plasma chamber does not be come constant, either.

Further, in the above method, variable capacitors and the like are mechanically driven, so that there is a drawback that generally it takes about 1 to 5 seconds to complete matching, which time varies for each implementation of the process.

A second mode for embodying the conventional impedance matching system comprises the steps of fixing the values of the capacitance and inductance in the impedance matching unit at the values (approximate values) matched with the impedance of an activated plasma chamber. Coping with changes in the plasma chamber-impedance with time, the oscillation frequency of the high frequency power oscillator is automatically controlled according to changes in the phase detection output attending the above mentioned changes in impedance with time, thereby automatically controlling the phase difference angle based on the reactance of the load so that the phase difference angle is zero degree. This system, though making no impedance adjustment, as described above, controls power to ensure that the supply power is equal to the set power plus a reflected wave power on the assumption that there is such reflected wave power in the high frequency power supply line. That is, it is intended, while setting supplied power (set power + reflective wave power) = cable power loss + impedance matching unit internal loss power + plasma chamber internal consumed power, to control the load power on the assumption that the proportion of the cable power loss+internal power loss of the impedance matching unit to the supplied power is substantially constant.

However, in the second method, it must be taken into account that in the case of the presence of a large amount of reflected wave power, a large amount of reactive current flows through the circuit, resulting in the cable power loss+internal power loss of the impedance matching unit being relatively large as compared with the case of a reduced amount of reflective wave power. Therefore, the aforesaid assumption for control formula concerning supplied power (set power+reflective power) is upset, and hence the internal consumed power of the plasma chamber cannot be controlled to take the set value. Furthermore, since the absolute amount of the power loss of the coaxial cable and the circuit thereafter cannot be measured, there has been a problem that the internal consumed power of the plasma chamber cannot be controlled as the absolute amount.

Table 1 shows that when the reflective wave power is 0 W in these two conventional methods, when it is 100 W in the method 1, and when it is 100 W in the method 2, the internal consumed power of the plasma chamber varies in each case according to changes in the internal power loss of the impedance matching unit.

TABLE 1

| PRIOR ART | HIGH FREQ. POWER OSC. | | | COAXIAL CABLE | IMPEDANCE MATCHING UNIT | PLASMA CHAMBER |
|---|---|---|---|---|---|---|
| | SET POWER[W] | REFLECTED-WEVE POWER[W] | SUPPLIED POWER[W] | CABLE-POWER LOSS[W] | IMP. MATCHING UNIT INTERNAL LOSS[W] | CONSUMED POWER OF PLASMA CHAMBER[W] |
| METHOD 1, 2 | 1000 | 0 | 1000 | −50 | −(150~200) | 750~800 |
| METHOD 1 | 1000 | 100 | 1000 | −60 | −(200~300) | 640~740 |
| METHOD 2 | 1000 | 100 | 1100 | −60 | −(200~300) | 740~840 |

↑
CONTROL POINT

Despite the present state described above of the impedance matching system used in the apparatus for plasma processing, apparatuses for processing semiconductors and the like with high frequency plasma have recently encountered a technical requirement for a thin film process, which requires (1) that the internal consumed power of the plasma chamber be controlled as an absolute amount, and (2) that power be supplied to the plasma chamber as rapidly as possible and with good reproducibility until a prescribed power is obtained. The intention is to satisfy the requirements for suppressing underetching or overetching in the case of etching process, and for making constant the film thickness and film quality in the case of CVD or sputtering. Further, in the case of a process in which the plasma processing time is 10 seconds or less, the ordinary matching time of 1–5 seconds is a length of time which cannot be ignored with regard to the processing time, and as long as the drawback of the matching time changing within this range is still present, the above-mentioned technical requirements of the semiconductor processing apparatus cannot be satisfied.

SUMMARY OF THE INVENTION

A first object of the present invention is to control the internal consumed power of a plasma chamber as an absolute amount without being influenced by the cable loss power and the internal loss power of an impedance matching unit. A second object is to effect the impedance matching between a high frequency power oscillator and a plasma chamber in an electrical response time which is realized by reason of the non-use of a mechanical impedance matching operation.

To solve the problem described above, the invention provides an impedance matching and power control system, including an impedance matching unit inserted in the rear end of a power feed line extending from a high frequency power oscillator to a plasma chamber, characterized in that:

a) said impedance matching unit comprises an input-associated detector including phase detection means disposed in the input side of an LC circuit forming the core of the matching unit, a load-associated detector having the function of detecting voltage, current, and phase angle, and an arithmetic and output section connected to said input-associated detector and load-associated detector, said impedance matching unit delivering a frequency control signal corresponding in magnitude to a phase detected by said phase detector, and a power signal representing the consumed power of the plasma chamber as calculated from the voltage, current and phase angle detected by said load-associated detector, b) said high frequency power oscillator comprises an oscillation control section for controlling the oscillation frequency thereof according to said frequency control signal, and an output control section including a summing amplifier which receives an external set power signal for the plasma chamber and a detection power signal representing said consumed power to find the difference between the two signals and controls the output power according to this difference so as to equalize the power consumption in the plasma chamber with the value of said external set power, whereby c) the impedance matching between the high frequency power oscillator and the plasma chamber is effected in an electrical response time without resorting to mechanical control.

According to the above arrangement, first the frequency of the high frequency power oscillator is controlled by the output from the phase detector disposed on the input side, thereby ensuring that the phase shift angle is zero.

Then, the LC network value necessary for load impedance adjustment is preliminarily set to a value (approximate value) which allows the operating impedance of the plasma chamber to match so as to minimize the difference between the pure resistance component R and the input impedance of 50 Ω in advance. Concerning such errors in the pure resistance component, there is installed a detector for detecting the voltage (V), current (I) and phase (θ) immediately before the plasma reaction chamber after passage through the capacitors and inductor which form the core of the impedance matching unit, thus measuring the effective power $P=V \cdot I \cdot \cos\theta$, which value is used to control the output power of the high frequency power oscillator according to the difference between it and the external set power.

In the present invention, said frequency control and output power control are simultaneously effected with respect to the high frequency power oscillator, whereby the impedance control between the high frequency power oscillator and the plasma chamber can be effected at a high speed corresponding to an electrical response time without being influenced by variations in power loss due to the generation of heat by the capacitors and inductor included in the impedance matching unit and without resorting to mechanical control.

In a preferred embodiment of the invention, a display device for displaying analytical charts such as the Smith chart and load power based voltage, current and phase detection signals from the load-associated detector may be connected as an output device for the arithmetic and output section.

DESCRIPTION OF THE PREFERRED EMBODIMENTS

Figure 1:
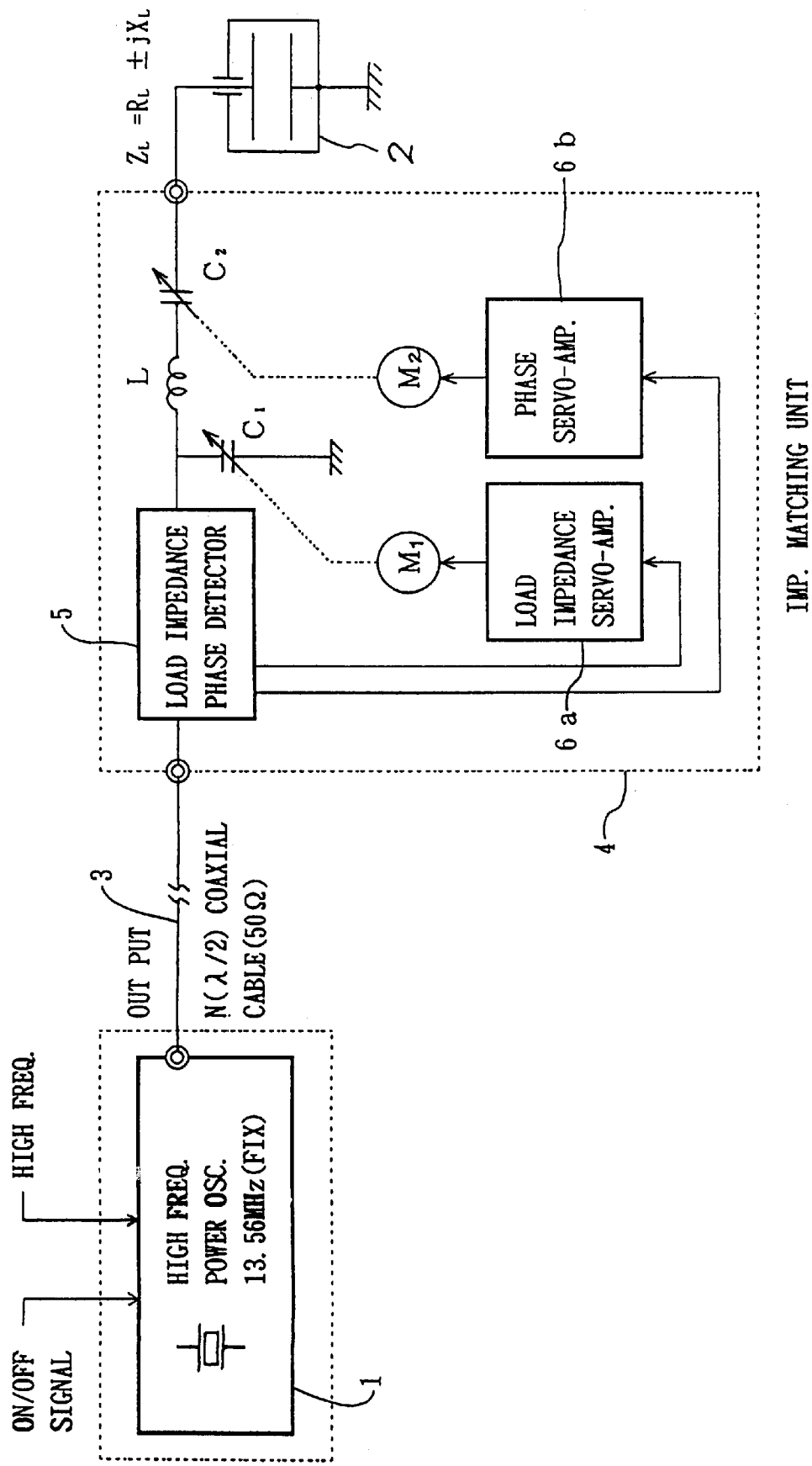
FIG. 1 is an electric circuit and block diagram showing an impedance matching circuit for a high frequency power supply line in a typical semiconductor processing apparatus of the conventional type.
Figure 2:
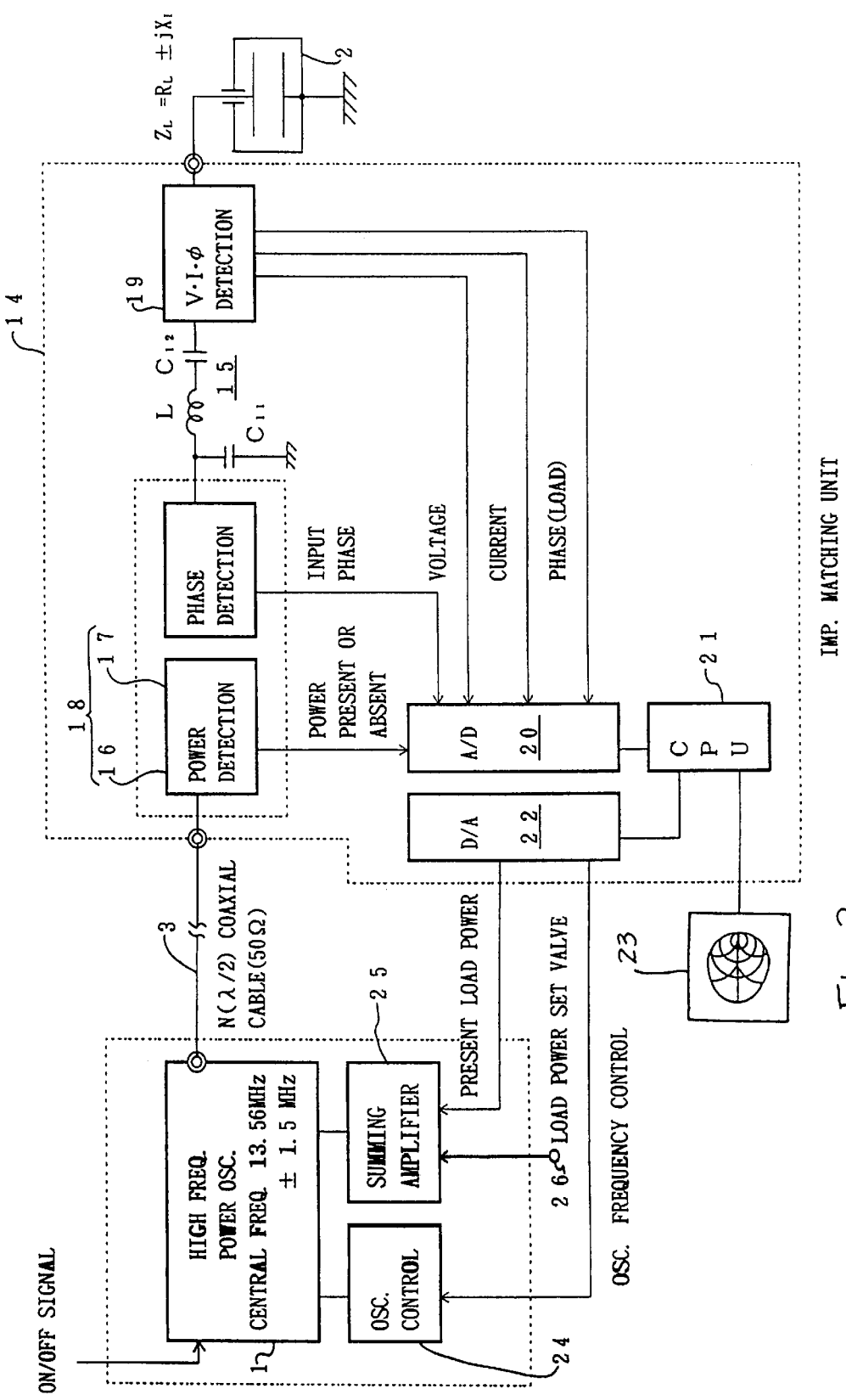
FIG. 2 is an electric circuit and block diagram for an impedance matching circuit in a first embodiment of the present invention.

FIG. 2 is a wiring and block diagram showing a first embodiment of the invention. As in the arrangement of the conventional apparatus, an impedance matching unit 14 of the present invention adapted to receive the output from a high frequency power oscillator 1 through a coaxial cable 3 having a length of an integral multiple of $\lambda/2$ ($\lambda$=wavelength) comprises an input-associated detecting section 18 including a phase detector 17 and a power detector 16 which are disposed on the input side of an LC circuit 15 forming the core of said unit, and a load-associated detector 19 disposed on the output side of the LC circuit and having the function of detecting the voltage (V), current (I) and phase angle ($\theta$), said unit further comprising an A/D converter 20 for receiving detection signals from the phase detector 17 and power detector 16 to effect A/D conversion thereof, an arithmetic and output section 21 composed of a CPU for performing necessary arithmetic operations and control by using the digital output from the A/D converter 20, and a D/A converter 22 for converting the digital output from said arithmetic and output section 21 into an analogue value. It is arranged that the output from the arithmetic and output section 21 is fed also to a display section 23. In addition, the value of the LC circuit has been set in advance so as to effect the matching of the operating impedance of the plasma chamber, as has already been described. Analog signal lines from the D/A converter 22 are connected to the oscillation control section 24 and the summing amplifier 25 which are connected as auxiliary control devices for the high frequency power oscillator 1.

The high frequency power oscillator 1 is adapted to oscillate or stop oscillation in response to an ON/OFF command from outside. First, in cases where the power detecting section 16 in the input-associated detector 18 detects no power being transmitted through the output feed line starting with the coaxial cable 3, such state is transmitted to the arithmetic and output section 21 through the A/D converter 20. The arithmetic and output section 21 feeds a 0V signal which means "0" power to the oscillation control section 24 through the D/A converter 22, thereby setting the high frequency power oscillator 1 to its central frequency, e.g., 13.56 MHz. When an external on-signal is fed to the high frequency power oscillator 1, the latter starts oscillating with this central frequency and the power detecting section 16 of the input-associated detector 18 detects the passage of power. Then, the phase between voltage and current in the input side of the impedance matching unit 14 is detected by the phase detecting section 17 and is converted into a digital signal by the A/D converter 20, said digital signal being fed to the arithmetic and output section 21, where it is converted into a frequency control signal which is a voltage corresponding to the size of this phase and which represents a deviation of the oscillation frequency from the tuned frequency (zero phase). This frequency control signal is fed as an analog signal to the oscillation control section 24 by the D/A converter 22. That is, if a positive or negative voltage is applied on the basis of the value of phase detection, the frequency is shifted from the central frequency of 13.56 MHz to provide a tuned frequency corresponding to V=0; the load as seen from the high frequency power source 1 is a pure resistance not containing an imaginary component. Thus, providing a pure resistance not containing an imaginary component improves the power efficiency and prevents the occurrence of unnecessary radiation power.

On the other hand, the voltage, current and phase signals from the load-associated detector 19 are fed through the A/D converter 20 to the arithmetic and control section 21, where the load P=V·I cos $\theta$, i.e., the effective power for the plasma chamber 2 is calculated, this power value being connected to the signal terminal of the summing amplifier 25 serving as the output control section connected to the power oscillator 1. This summing amplifier 25 is provided with a power setting terminal 26 and the summing amplifier 25 produces a control signal corresponding to the difference between the power setting signal and the load signal to control the high frequency power oscillator 1, the latter producing an output such that the difference between the power setting signal and the load signal disappears, that is, the load power equals to the set value of power. That is, the effective power to be consumed by the plasma chamber is fed as a dc current through the arithmetic operation P=V·I cos$\theta$ to the summing amplifier 25 by the arithmetic and control section 21, the summing amplifier 25 being adapted to control the high frequency power oscillator 1 by using the difference between the power setting voltage and this power value voltage as a correcting value, so as to feed the necessary set power to the plasma chamber 2.

Figure 3:
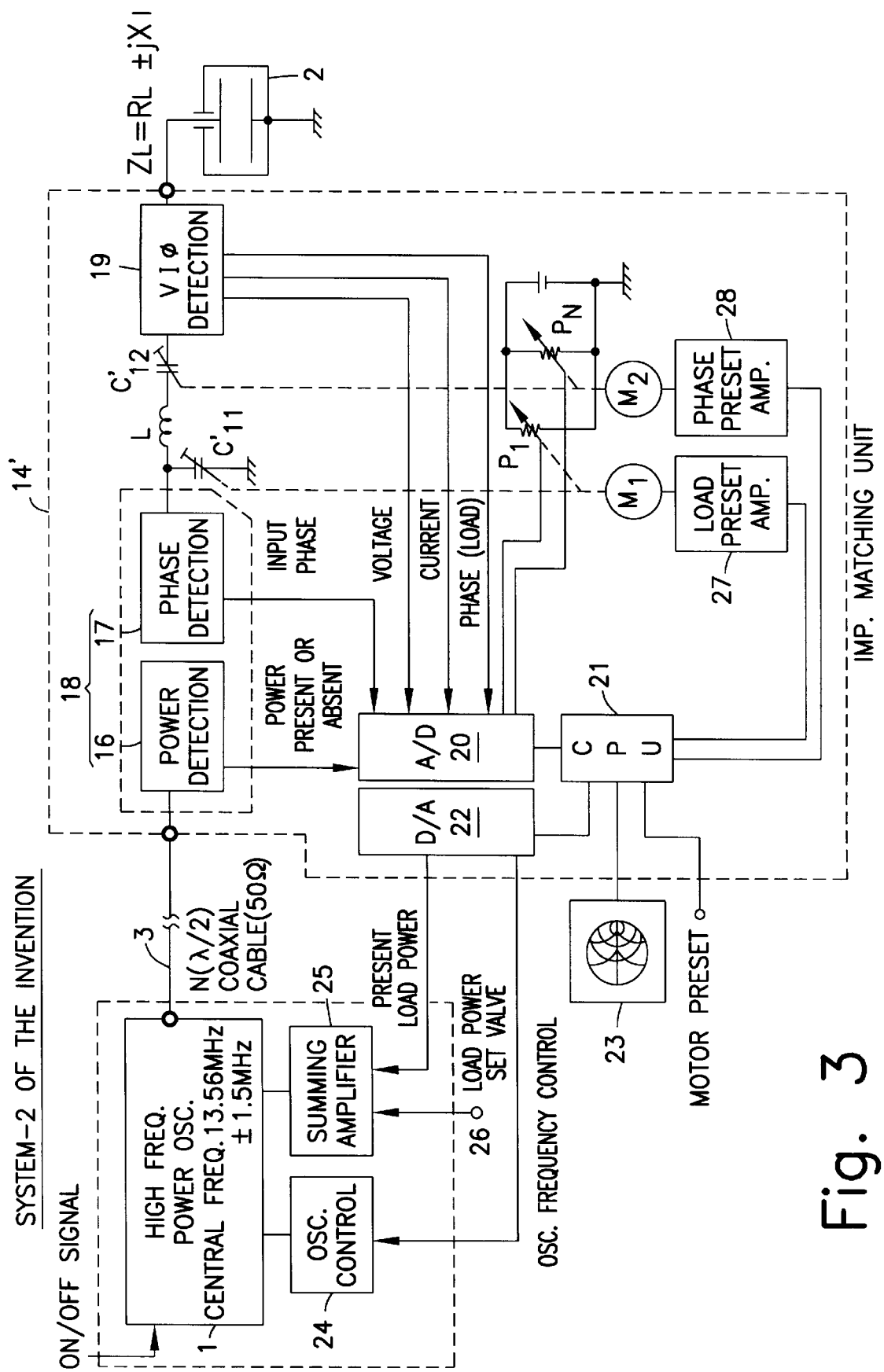
FIG. 3 is an electric circuit and block diagram for an impedance matching circuit in a second embodiment of the present invention.
Figure 4:
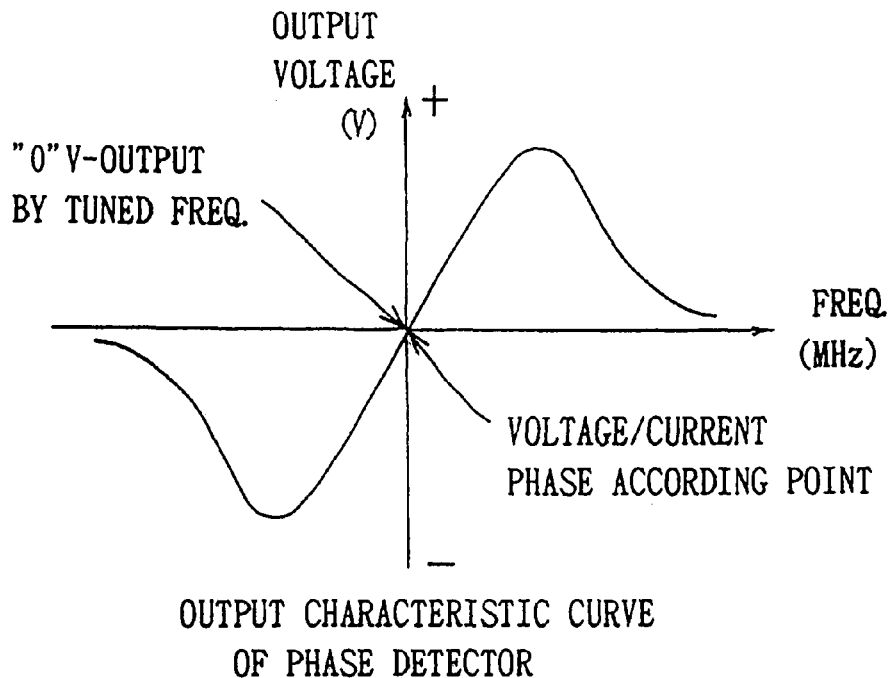
FIG. 4 is a graph showing an output characteristic curve of a phase detector representing the relationship between load phase and frequency denoted by voltage.
Figure 5:
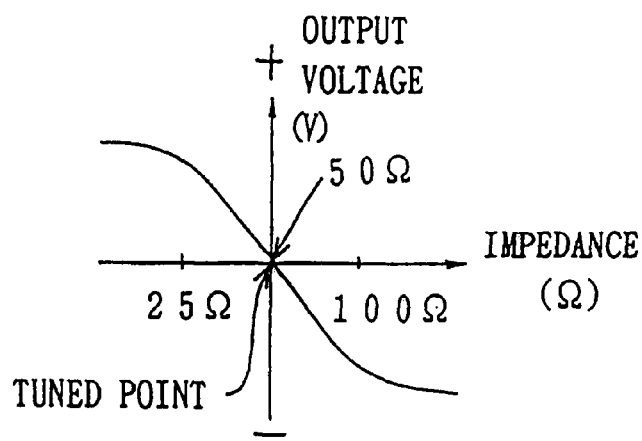
FIG. 5 is a graph showing an output characteristic curve of a load impedance detector showing the relationship between any 50-$\Omega$ load and the load impedance denoted by voltage.

Referring to FIG. 3, a second embodiment of the invention will be described. This embodiment includes an arrangement for presetting the LC value which was fixed in the preceding embodiment, so as to make it possible to follow various conditions for the plasma process. That is, this is a system which is used when the value of LC is fixed, particularly in cases where it is impossible to follow said conditions with a frequency shift alone provided by the high frequency power oscillator 1 or in cases where the difference between the load impedance under particular conditions and the usual load of 50 $\Omega$ is too large (for example, when the usual process conditions are shifted to chamber cleaning conditions). Therefore, in this embodiment, an adjustable capacitor $C_{11}'$ for presetting the load impedance and an adjustable capacitor $C_{12}'$ for presetting the load phase are inserted in the LC circuit between the input terminal of the inductor L and the ground potential and between the output terminal of the inductor L and the load-associated detector 19, respectively. And servo motors $M_1$ and $M_2$ for driving them are driven by a load presetting amplifier 27 and a phase presetting amplifier 28 which are connected to the arithmetic and output section 21. In such presetting arrangement, when the LC value of the impedance matching unit 14' is to be preset, first the plasma chamber is operated under conditions which are a model of the plasma process and simultaneously therewith the capacitances of the adjustable capacitor $C_{11}'$ for presetting and the adjustable capacitor $C_{12}'$ for presetting load phase are set so as to establish the impedance matching between the output impedance of the high frequency power oscillator 1 and the (load) impedance of the plasma chamber while fixing the high frequency power oscillator 1 in the standard state. After the setting of the capacitances, when the system is operating under other process conditions, the capacitances are stored in the arithmetic and output section 21 as sweeper positions for potentiometers $P_1$ and $P_2$ driven in operative association with the adjustable capacitors $C_{11}'$ and $C_{12}'$. Therefore, when the system is to be operated again by this process, said arithmetic and output section 21 drives the preset-drive amplifiers 27 and 28 on the basis of the stored values and rotates the servo motors to establish the set values for the $C_{11}'$ and $C_{12}'$ for the process conditions.

After the presetting has been effected in this manner, the operation of the apparatus for high frequency plasma processing under the plasma process conditions is effected by the operation of the electronic circuit alone as in the case of the first embodiment at an electrical response rate without resorting to mechanical control.

Table 2 shows that in the present invention if the external set value of power given to the high frequency power oscillator 1 is, e.g., 750 W, the internal power consumption of the plasma chamber is maintained at the same 750 W even if the internal power loss of the impedance matching unit varies between 150 W and 200 W.

TABLE 2

| HIGH FREQ. POWER OSC. SET LOAD POWER(750 W) + CORRECTION BY SUM. AMP. [W] | COAXIAL CABLE CABLE − POWER LOSS[W] | IMPEDANCE MATCHING UNIT IMP. MATCHING UNIT INTERNAL LOSS[W] | PLASMA CHAMBER CONSUMED POWER OF PLASMA CHAMBER[W] |
|---|---|---|---|
| 950~1000 | −50 | −(150~200) | 750 (CONST.) |
| (SYSTEM OF THE INVENTION) | | ↑ CONTROL POINT | |

As described above, the present invention has made it possible to control the internal consumed power of the plasma chamber as an absolute amount without being influenced by the cable power loss and the internal loss of the impedance matching unit in the constitution for a high frequency plasma process used in a semiconductor controlling apparatus.

Further, the control system of the present invention, when used in the ordinary process control, controls a high frequency power oscillator at an electrical response rate without resorting to mechanical control, and effects the impedance matching between it and the plasma chamber at high speed.

What is claimed is:

1. An impedance matching and power control system, including an impedance matching unit inserted in the terminal end of a power feed line extending from a high frequency power oscillator to a plasma chamber, characterized in that:

a) said impedance matching unit comprises an input-associated detector including phase detection means disposed in the input side of an LC circuit forming the core of the matching unit, a load-associated detector having the function of detecting voltage, current, and phase angle disposed on the output side of said LC circuit, and an arithmetic and output section connected to said input-associated detector and load-associated detector, said impedance matching unit delivering a frequency control signal corresponding in magnitude to a phase detected by said phase detector, and delivering a power signal representing the consumed power of the plasma chamber as calculated from the voltage, current and phase angle detected by said load-associated detector, b) said high frequency power oscillator comprises an oscillation control section for controlling the oscillation frequency thereof according to said frequency control signal, and an output control section including a summing amplifier which receives an external set power signal for the plasma chamber and a detection power signal representing said consumed power to find the difference between the two signals and controls the output power according to the difference so as to equalize the power consumption in the plasma chamber with the value of said external set power, whereby c) the impedance matching between the high frequency power oscillator and the plasma chamber is effected at an electrical response rate without resorting to mechanical control.

2. A system as set forth in claim 1, characterized in that said input-associated detector in said impedance matching unit includes power detecting means for detecting whether or not a high frequency power is being transferred through said power feed line, the arrangement being such that when such high frequency power is not transferred, said impedance matching unit transfers said high frequency control signal, whose size is taken to be zero, to said oscillation control section, thereby setting the central frequency in the oscillation power of said high frequency power oscillator.

3. A system as set forth in claim 1 or 2, characterized in that said arithmetic and output section of said impedance matching unit has a display device connected thereto, so as to display the load power calculated from the oscillation frequency control signal or the voltage-current phase detected by said phase detector and the voltage, current and phase angle detected by said load-associated detector.

4. A system as set forth in claim 1 or 2, characterized in that said impedance matching unit comprises a variable capacitor in said LC circuit for presetting the load impedance, an adjustable capacitor in said LC circuit for presetting the load phase, first and second servo motors for respectively adjusting these capacitors, and first and second preset drive amplifiers for respectively driving said servo motors for rotation, said arithmetic and output section being adapted to calculate control signals for driving said servo motors to be fed to said first and second preset drive amplifiers so as to set said two adjustable capacitors to respectively preset the load impedance and the load phase into values which enable the impedance matching between the output impedance of the high frequency power oscillator and the load impedance of the plasma chamber with the high frequency power oscillator fixed in the standard state under various plasma chamber conditions.

* * * * *